(12) United States Patent  
Bando et al.

(10) Patent No.: US 12,431,439 B2  
(45) Date of Patent: Sep. 30, 2025

(54) SEMICONDUCTOR PACKAGE AND SEMICONDUCTOR DEVICE

(71) Applicant: KIOXIA CORPORATION, Tokyo (JP)

(72) Inventors: Ryujiro Bando, Inagi (JP); Hitoshi Ikei, Yokohama (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/494,827

(22) Filed: Oct. 26, 2023

(65) Prior Publication Data

US 2024/0055370 A1  Feb. 15, 2024

Related U.S. Application Data

(63) Continuation of application No. 17/200,411, filed on Mar. 12, 2021, now Pat. No. 11,837,554.

(30) Foreign Application Priority Data

Mar. 17, 2020  (JP) ................................ 2020-046800

(51) Int. Cl.  
 *H01L 23/552* (2006.01)  
 *H05K 1/03* (2006.01)  
 (Continued)

(52) U.S. Cl.  
 CPC ......... *H01L 23/552* (2013.01); *H05K 1/0306* (2013.01); *H01L 23/49816* (2013.01);  
 (Continued)

(58) Field of Classification Search  
None  
See application file for complete search history.

(56) References Cited

U.S. PATENT DOCUMENTS 5,984,165 A 11/1999 Inoue et al.  
11,322,478 B2 * 5/2022 Yamano ................. H01L 24/97  
 (Continued)

FOREIGN PATENT DOCUMENTS

JP  60-31218 A  2/1985  
JP  60-98649 A  6/1985  
 (Continued)

OTHER PUBLICATIONS

Seiki Sakuyama, "Infrared Reflow Soldering Technology", Journal of Japan Institute of Electronics Packaging, vol. 2, No. 7, 1999, 24 pages (with Machine Generated English Translation).

*Primary Examiner* — Long Pham  
(74) *Attorney, Agent, or Firm* — Oblon, McClelland, Maier & Neustadt, L.L.P.

(57) ABSTRACT

A semiconductor package of an embodiment includes a wiring substrate, a semiconductor chip provided on an upper surface of the wiring substrate, a sealing resin covering surfaces of the wiring substrate and the semiconductor chip, an infrared reflection layer containing any of aluminum, aluminum oxide, and titanium oxide, and an external terminal provided on a lower surface of the wiring substrate. The wiring substrate is electrically connectable with a printed wiring board through the external terminal. The infrared reflection layer is provided to the sealing resin on an upper side of a surface of the semiconductor chip on a side opposite to an upper surface of the wiring substrate.

7 Claims, 8 Drawing Sheets

(51) Int. Cl.
  *H01L 23/00*    (2006.01)
  *H01L 23/498*   (2006.01)
  *H01L 25/065*   (2023.01)
  *H05K 1/18*    (2006.01)
  *H05K 3/34*    (2006.01)

(52) U.S. Cl.
  CPC .......... *H01L 24/32* (2013.01); *H01L 25/0657* (2013.01); *H01L 2224/32145* (2013.01); *H01L 2224/32225* (2013.01); *H01L 2225/06562* (2013.01); *H01L 2924/14511* (2013.01); *H05K 1/181* (2013.01); *H05K 3/3494* (2013.01); *H05K 2201/0112* (2013.01); *H05K 2201/0175* (2013.01); *H05K 2201/0989* (2013.01); *H05K 2201/10159* (2013.01)

(56) References Cited

U.S. PATENT DOCUMENTS

| | | | |
|---|---|---|---|
| 11,502,057 B2* | 11/2022 | Homma | H01L 21/563 |
| 2005/0151554 A1* | 7/2005 | Rae | H01L 23/36 |
| | | | 257/E23.101 |
| 2021/0296256 A1* | 9/2021 | Bando | H05K 1/0306 |

FOREIGN PATENT DOCUMENTS

| | | |
|---|---|---|
| JP | 4-209671 A | 7/1992 |
| JP | 5-235191 A | 9/1993 |
| JP | 2002-118357 A | 4/2002 |
| JP | 3330037 B2 | 9/2002 |
| JP | 6373811 B2 | 8/2018 |

* cited by examiner

US 12,431,439 B2

SEMICONDUCTOR PACKAGE AND SEMICONDUCTOR DEVICE

CROSS-REFERENCE TO RELATED APPLICATIONS

This application is a continuation of and claims benefit under 35 U.S.C. § 120 to U.S. application Ser. No. 17/200,411, filed Mar. 12, 2021, and claims the benefit of priority under 35 U.S.C. § 119 from Japanese Patent Application No. 2020-046800 filed Mar. 17, 2020, the entire contents of each of which are incorporated herein by reference.

FIELD

Embodiments described herein relate generally to a semiconductor package and a semiconductor device.

BACKGROUND

In a known semiconductor device, a semiconductor package in which a semiconductor chip is mounted is electrically connected with a mounting substrate through a ball grid array (BGA).

DETAILED DESCRIPTION

A semiconductor package of an embodiment includes: a wiring substrate having a first surface and a second surface on a side opposite to the first surface; a semiconductor chip provided on the first surface of the wiring substrate; a sealing resin covering the first surface of the wiring substrate and surfaces of the semiconductor chip; an infrared reflection layer containing any of aluminum, aluminum oxide, and titanium oxide; and an external terminal provided on the second surface of the wiring substrate. The wiring substrate is electrically connectable with a printed wiring board through the external terminal. The infrared reflection layer is provided to the sealing resin on an upper side of a surface of the semiconductor chip on a side opposite to the first surface side of the wiring substrate.

Embodiments will be described below with reference to the accompanying drawings.

First Embodiment

Figure 1:
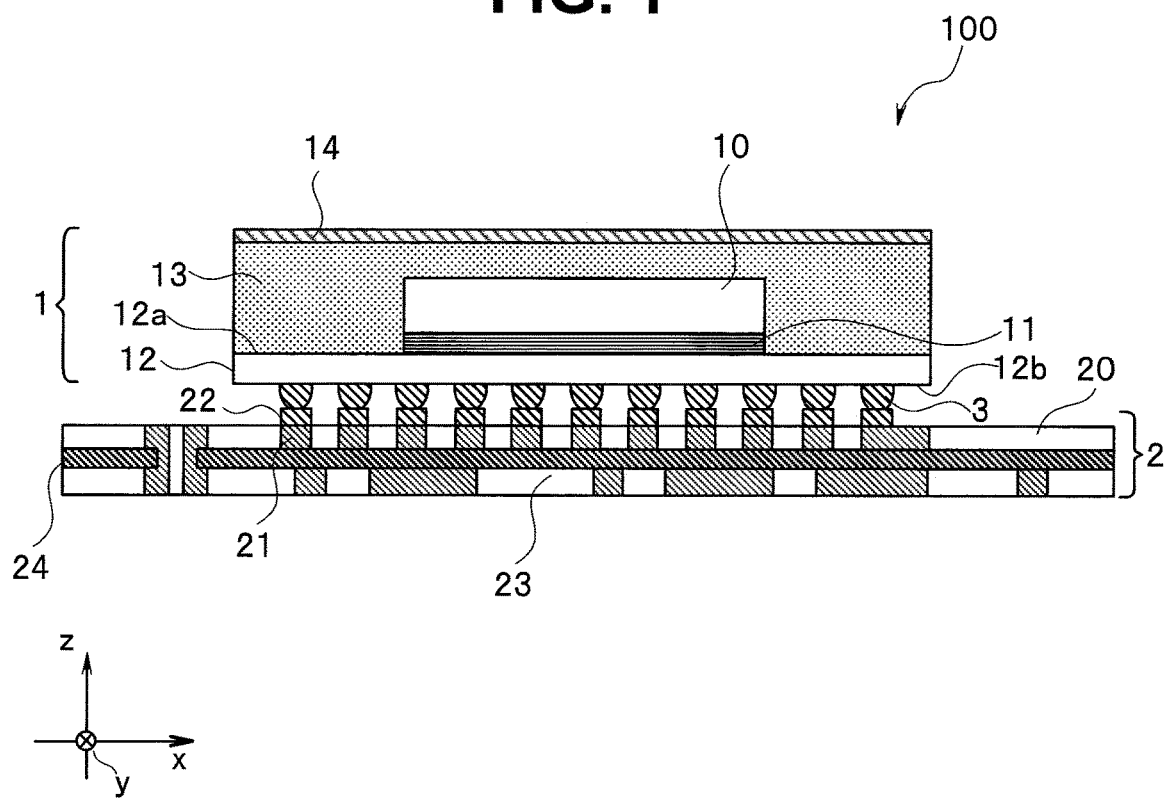
FIG. 1 is a cross-sectional view illustrating the structure of a semiconductor device according to a first embodiment of the present invention.

FIG. 1 is a cross-sectional view illustrating the structure of a semiconductor device 100 according to a first embodiment of the present invention. In the following description, an xyz coordinate system as an example of an orthogonal coordinate system is used. Specifically, an xy plane is defined to be a plane parallel to a surface of a wiring substrate 12 included in the semiconductor device 100, and a z axis is defined to be a direction orthogonal to the xy plane. An x axis and a y axis are defined to be two directions orthogonal each other in the xy plane. Note that, for the purpose of description, an up-down relation in which an upper side is defined to be the positive direction side on the z axis (a first surface 12a side of the wiring substrate 12) and a lower side is defined to be the negative direction side on the z axis (a second surface 12b side of the wiring substrate 12) is used in the following description, but does not necessarily indicate a universal up-down relation.

FIG. 1 illustrates the structure of the semiconductor device 100 at a section (hereinafter referred to as an xz section) taken along an xz plane. The semiconductor device 100 illustrated in FIG. 1 includes a semiconductor package 1 and a printed wiring board 2. The semiconductor package 1 includes a semiconductor chip 10, the wiring substrate 12, a sealing resin 13, and an infrared reflection layer 14.

The wiring substrate 12 is, for example, an insulation resin wiring substrate or ceramic wiring substrate on or in which a wiring layer (not illustrated) is provided. Specifically, for example, a print wiring substrate formed of glass-epoxy resin is used. Typically, a solder resist as wiring protection is applied on surfaces of the wiring substrate 12. The wiring substrate 12 has the first surface 12a and the second surface 12b. An external terminal 3 (a protruding terminal such as a solder ball; hereinafter referred to as a solder ball 3) for a BGA package is provided on the second surface 12b.

The semiconductor chip 10 is provided on the first surface 12a of the wiring substrate 12. The semiconductor chip 10 is a semiconductor chip such as a NAND flash memory but this is not restrictive. Other semiconductor chips including a storage element such as a dynamic random access memory (DRAM), a calculation element such as a microprocessor, or a signal processing element can be used as the semiconductor chip 10. A film bonding agent 11 is bonded to the entire back surface of the semiconductor chip 10.

The film bonding agent 11 is made of a thermoset resin (for example, an epoxy resin, a polyimide resin, an acrylic resin, or a mixture of these resins). The film bonding agent 11 is, for example, a die attach film (DAF), or a film on wire (FOW) in which a conductive wire can be embedded. The semiconductor chip 10 is firmly fixed to the wiring substrate 12 through the film bonding agent 11. The semiconductor chip 10 and the wiring substrate 12 are electrically connected with each other through a conductive member (not illustrated) such as a conductive wire.

The outer periphery of the semiconductor chip 10 is sealed by the sealing resin 13 provided on the upper surface of the wiring substrate 12. The infrared reflection layer 14 is formed on the entire upper surface of the sealing resin 13. The infrared reflection layer 14 is provided to reduce heat stress (more specifically, heating by infrared radiation heat) applied on the semiconductor chip 10 when the semiconductor package 1 is mounted on the printed wiring board 2. Thus, the infrared reflection layer 14 is preferably formed of a material having a low infrared absorption rate. For example, the infrared reflection layer 14 is formed of copper (Cu) or aluminum (Al), which has an absorption rate of 5% approximately or 4% approximately, respectively, for infrared of a wavelength of 3 to 5 μm. For example, after the semiconductor chip 10 mounted on the upper surface of the wiring substrate 12 is sealed by the sealing resin 13, a metallic material is sputtered to adhere to and accumulate on the upper surface of the sealing resin 13. In this manner, the infrared reflection layer 14 can be formed. Alternatively, the infrared reflection layer 14 may be formed of a metallic compound such as aluminum oxide ($Al_2O_3$; having an infrared absorption rate of 40% approximately) or titanium oxide ($TiO_2$; having an infrared absorption rate of 50% approximately).

In the printed wiring board 2, a wiring layer 24 in which a circuit pattern is provided is formed on the upper surface of a mounting substrate 23 formed of an insulation material such as a glass epoxy resin. The wiring layer 24 is formed of a conductive metal such as gold (Au), silver (Ag), copper (Cu), aluminum (Al), nickel (Ni), palladium (Pd), or tungsten (W), A circuit protection layer 20 formed of a solder resist is formed on surfaces of the wiring layer 24. A via is provided through the circuit protection layer 20 to electrically connect the wiring layer 24 and the solder ball 3 provided to the semiconductor package 1, and a mounting substrate terminal 21 formed of a conductive metal is formed inside the via. Solder paste 22 is applied (printed) on the upper surface of the mounting substrate terminal 21 to connect the solder ball 3 and the mounting substrate terminal 21.

An entire heating scheme such as an infrared reflow scheme or a heated air reflow scheme is used when the semiconductor package 1 is mounted on the printed wiring board 2. Typically, the entire heating scheme is performed as follows. First, the printed wiring board 2 on which the semiconductor package 1 is placed is mounted on a holding table inside a reflow furnace. In this case, the semiconductor package 1 is placed on the printed wiring board 2 while positioning is performed between the solder ball 3 and the solder paste 22. In the reflow furnace, heat sources are installed above the semiconductor package 1 and below the printed wiring board 2. Heat generated by the heat sources is transferred to the solder ball 3 and the solder paste 22 through convection, radiation, and conduction, thereby melting the solder ball 3 and the solder paste 22. Lastly, the solder ball 3 and the solder paste 22 are joined together through entire cooling, and accordingly, the semiconductor package 1 is mounted on the printed wiring board 2.

In a case of the heated air reflow scheme, an atmosphere (air or nitrogen) heated by a heater as a heat source is circulated in the reflow furnace to generate convection heat. Through conduction of the convection heat, the solder ball 3 and the solder paste 22 are melted and joined together. In the heated air reflow scheme, the convection heat is directly conducted to the solder ball 3 and the solder paste 22. Accordingly, heat stress on the semiconductor chip 10 molded in the semiconductor package 1 is relatively small. However, it takes time for the convection heat to conduct to the solder ball 3 and the solder paste 22 and melt them, and thus productivity decreases.

However, the infrared reflow scheme, with which reflow is possible in a short time period, has been recently mainly employed in mounting of an electronic component including a semiconductor device. In the infrared reflow scheme, the semiconductor package 1 and the printed wiring board 2 are irradiated with infrared from an infrared heater as a heat source. The infrared is absorbed by the upper surface of the semiconductor package 1 and the upper and lower surfaces of the printed wiring board 2 and generates radiation heat at and inside these surfaces. Then, the generated heat conducts inside the semiconductor package 1 and the printed wiring board 2 and reaches the solder ball 3 and the solder paste 22. Thus, in the infrared reflow scheme, the semiconductor package 1 and the printed wiring board 2 need to be heated to temperature equal to or higher than the melting temperature of the solder ball 3 and the melting temperature of the solder paste 22 so that the solder ball 3 and the solder paste 22 are melted.

Recently, a method of writing data to the semiconductor chip 10 before molding to the wiring substrate 12 has been used, depending on product usage. This is because of an advantage that, in a case of a smart phone, for example, the number of simultaneous measurements can be increased due to difference between the package size of a product substrate and the package size of the semiconductor chip 10 such as a NAND flash memory. Another advantage is that access is easier and writing speed is faster, which improves production efficiency, with data writing to the semiconductor chip 10 by using a memory tester than with data writing to the semiconductor package 1.

When the infrared reflow scheme is used to mount the semiconductor package 1, which includes the semiconductor chip 10 in which data is written in this manner, on the printed wiring board 2, radiation heat generated at the surface of the semiconductor package 1 and inside of the semiconductor package 1 is applied to the semiconductor chip 10. As the semiconductor chip 10 is heated and the temperature of the semiconductor chip 10 increases, retention property of the written data potentially degrades and reliability decreases.

In the present embodiment, since the infrared reflection layer 14 is provided on the upper surface of the semiconductor package 1, it is possible to reflect infrared incident from above the semiconductor package 1, thereby reducing the amount of radiation heat generated at the upper surface of the semiconductor package 1 and inside of the semiconductor package 1. Accordingly, it is possible to prevent the temperature of the semiconductor chip 10 from increasing due to the radiation heat. Thus, it is possible to prevent degradation of the data written in the semiconductor chip 10, thereby improving reliability.

Note that heat necessary for melting the solder ball 3 and the solder paste 22 is supplied as radiation heat generated at the upper and lower surfaces of the printed wiring board 2 conducts inside the printed wiring board 2. Thus, mounting of the semiconductor package 1 and the printed wiring board 2 is performed without problems.

In other words, in the present embodiment, the amount of radiation heat generated at the upper surface of the semiconductor package 1 and inside of the semiconductor package 1 is reduced so that the speed of temperature increase of the semiconductor package 1 is lower than the speed of temperature increase of the printed wiring board 2. Accordingly, in a predetermined duration, the amount of heat added to the semiconductor chip 10 by radiation heat generated at the surface of the semiconductor package 1 and inside of the semiconductor package 1 is smaller than the amount of heat added to the solder ball 3 and the solder paste 22 by radiation heat conducting inside the printed wiring board 2. Thus, it is possible to reduce the amount of heat conducted to the semiconductor chip 10 in a duration until heat conducts in an amount necessary for melting the solder ball 3 and the solder paste 22 and the semiconductor package 1 and the printed wiring board 2 are mounted. As a result, temperature increase of the semiconductor chip 10 is reduced, which can prevent degradation of the written data and improve reliability.

First Modification

Part of infrared incident on the upper surface of the semiconductor package 1 transmits through the upper surface and is converted into thermal energy inside the sealing resin 13. When the infrared reflection layer 14 is formed, on the upper side of the semiconductor chip 10, as an intermediate layer in the sealing resin 13 with which the semiconductor package 1 is filled, it is possible to reflect infrared that would be otherwise absorbed inside the semiconductor package 1, thereby reducing the amount of heat added to the semiconductor chip 10.

Figure 2:
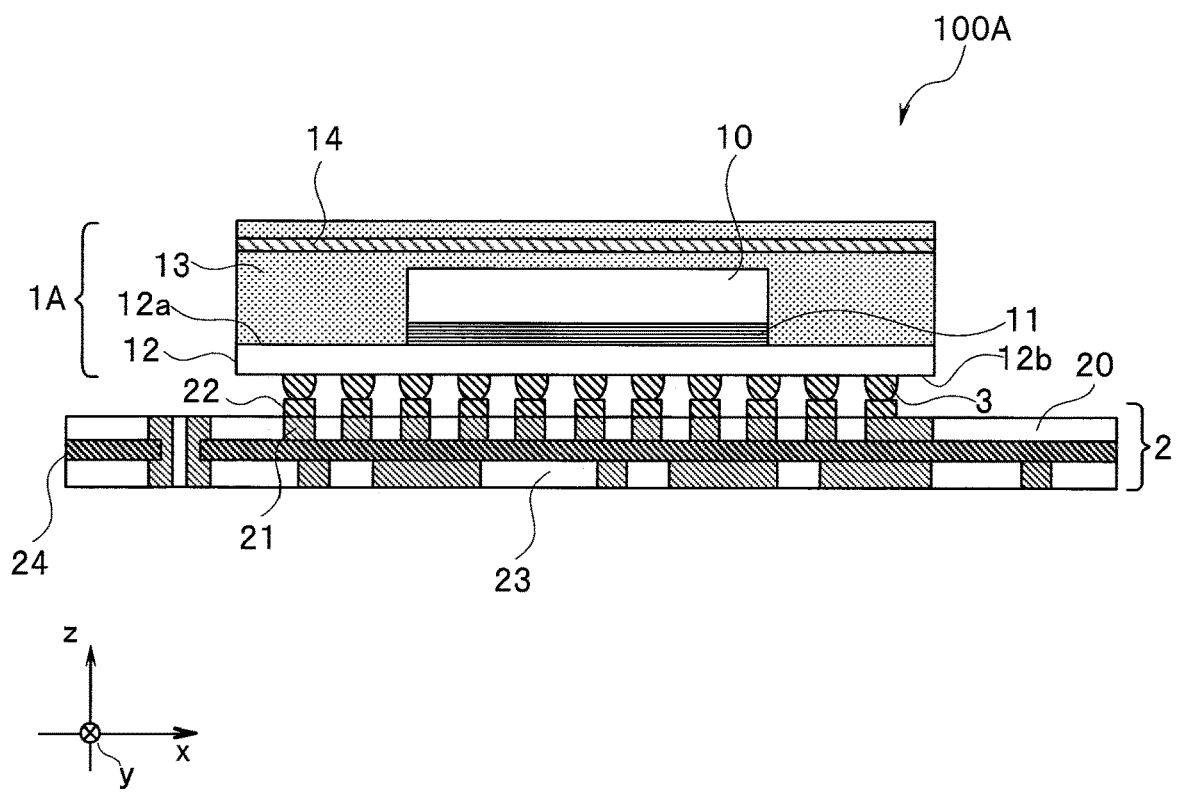
FIG. 2 is a cross-sectional view illustrating the structure of a semiconductor device according to a first modification of the first embodiment.

FIG. 2 is a cross-sectional view illustrating the structure of a semiconductor device according to a first modification of the first embodiment. In this semiconductor device 100A illustrated in FIG. 2, the position of the infrared reflection layer 14 provided to a semiconductor package 1A is different from that in the semiconductor device 100 illustrated in FIG. 1. Other components are the same as those of the semiconductor device 100 illustrated in FIG. 1 and thus is denoted by the same reference sign, and description thereof is omitted. The material of the infrared reflection layer 14 is same as that of the infrared reflection layer 14 of the semiconductor device 100 illustrated in FIG. 1, Specifically, the infrared reflection layer 14 is formed of a metal (such as copper (Cu) or aluminum (Al)) having a low infrared absorption rate or an insulator (such as aluminum oxide ($Al_2O_3$)) having a low infrared absorption rate.

As illustrated in FIG. 2, when the infrared reflection layer 14 is formed as an intermediate layer (layer between the upper surface of the semiconductor chip 10 and the upper surface of the semiconductor package 1A) in the sealing resin 13, for example, a method as described below may be used. First, the wiring substrate 12 that the semiconductor chip 10 is placed on and electrically connected with is installed in a mold. Subsequently, the sealing resin 13 being melted is poured into the mold being heated until the mold is filled with the sealing resin 13 up to a predetermined height. The predetermined height corresponds to the position of the lower surface of the infrared reflection layer 14.

Subsequently, a material (such as copper (Cu), aluminum (Al) or aluminum oxide ($Al_2O_3$)) of which the infrared reflection layer 14 is to be formed, is applied to the upper surface of the charged sealing resin 13. The material of which the infrared reflection layer 14 is to be formed, is desirably in the state of fine particles. Note that, when a sheet material (for example, a resin sheet in which thin metal foil of aluminum (Al) is sealed) having a melting point higher than the melting temperature (for example, 150° C. approximately) of the sealing resin 13 is available, the upper surface of the charged sealing resin 13 may be covered by the sheet material. Lastly, the sealing resin 13 being melted is further poured onto the infrared reflection layer 14 and cured. In this manner, the semiconductor package 1A in which the infrared reflection layer 14 is embedded as an intermediate layer in the sealing resin 13 can be formed.

Note that when the infrared reflection layer 14 is formed as an intermediate layer in the sealing resin 13, the infrared reflection layer 14 is preferably insulative. Thus, when a metal such as copper (Cu) or aluminum (Al) is used, the infrared reflection layer 14 is preferably a three-layer structure film in which the upper and lower surfaces of a metal film are covered by an insulating film. For example, the upper surface is preferably formed of an insulation material having properties with infrared transparency, for example, titanium oxide ($TiO_2$), and the lower surface is preferably formed of an insulation material having properties without infrared transparency, for example, a nitride material such as titanium nitride (TiN). Note that when the infrared reflection layer 14 is formed of an insulation material such as aluminum oxide ($Al_2O_3$; having an infrared absorption rate of 40% approximately), the upper and lower surfaces of the infrared reflection layer 14 do not need to be covered by an insulation layer. Thus, the infrared reflection layer 14 can be formed at a small thickness, which leads to reduction of the thickness of the semiconductor device 100A.

In the present embodiment, the infrared reflection layer 14 is provided as an intermediate layer in the sealing resin 13 above the upper surface of the semiconductor chip 10. Since the infrared reflection layer 14 is formed near the semiconductor chip 10, infrared absorbed at the upper surface of the semiconductor package 1A and transmitted inside the sealing resin 13 can be reflected and prevented from reaching the semiconductor chip 10. Accordingly, the amount of radiation heat due to infrared absorbed at the upper surface of the semiconductor package 1A and transmitted through the sealing resin 13 can be reduced.

Second Modification

When formed as an intermediate layer of the sealing resin 13 filling the semiconductor package 1, the infrared reflection layer 14 may be formed only in a partial region including a region positioned on the upper surface of the semiconductor chip 10 instead of being formed in the entire region on the upper surface of the sealing resin 13 filling halfway through as in the first modification. When formed at least on the upper side of the upper surface of the semiconductor chip 10, the infrared reflection layer 14 can reflect infrared that would be otherwise absorbed inside the semiconductor package 1, thereby reducing the amount of heat added to the semiconductor chip 10.

Figure 3:
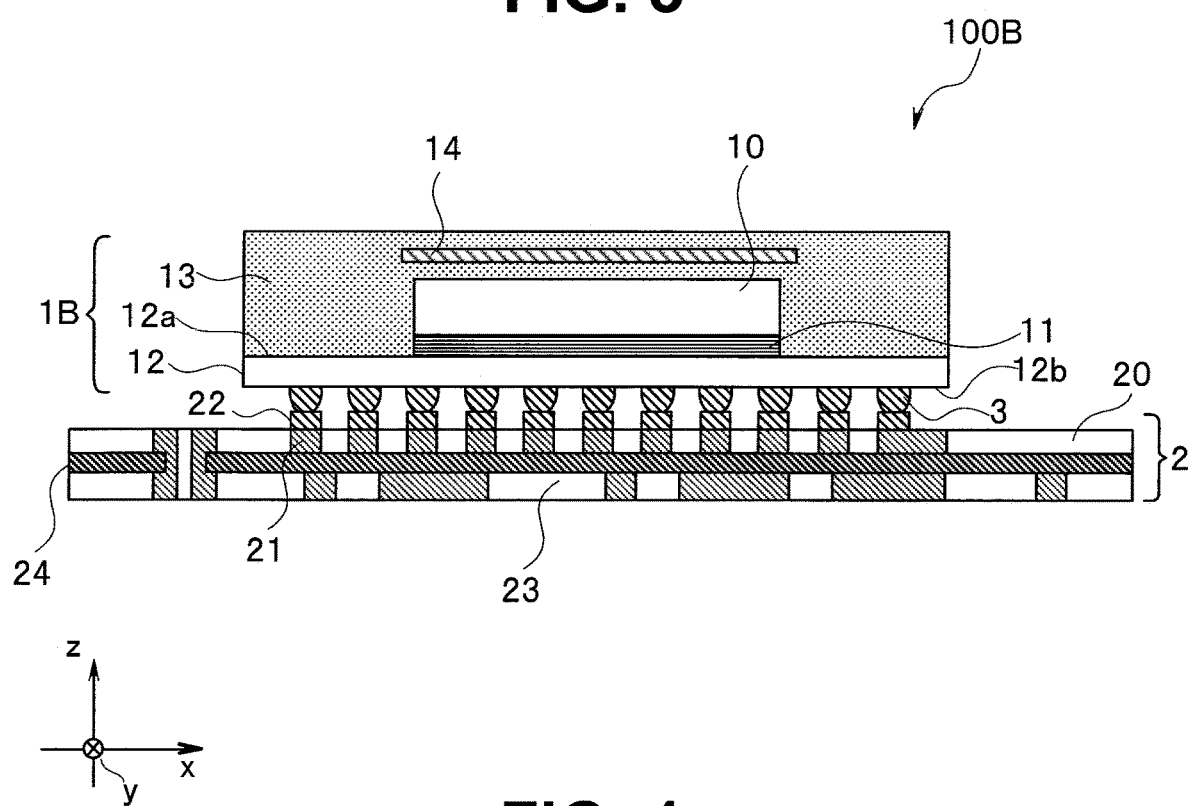
FIG. 3 is a cross-sectional view illustrating the structure of a semiconductor device according to a second modification of the first embodiment.
Figure 4:
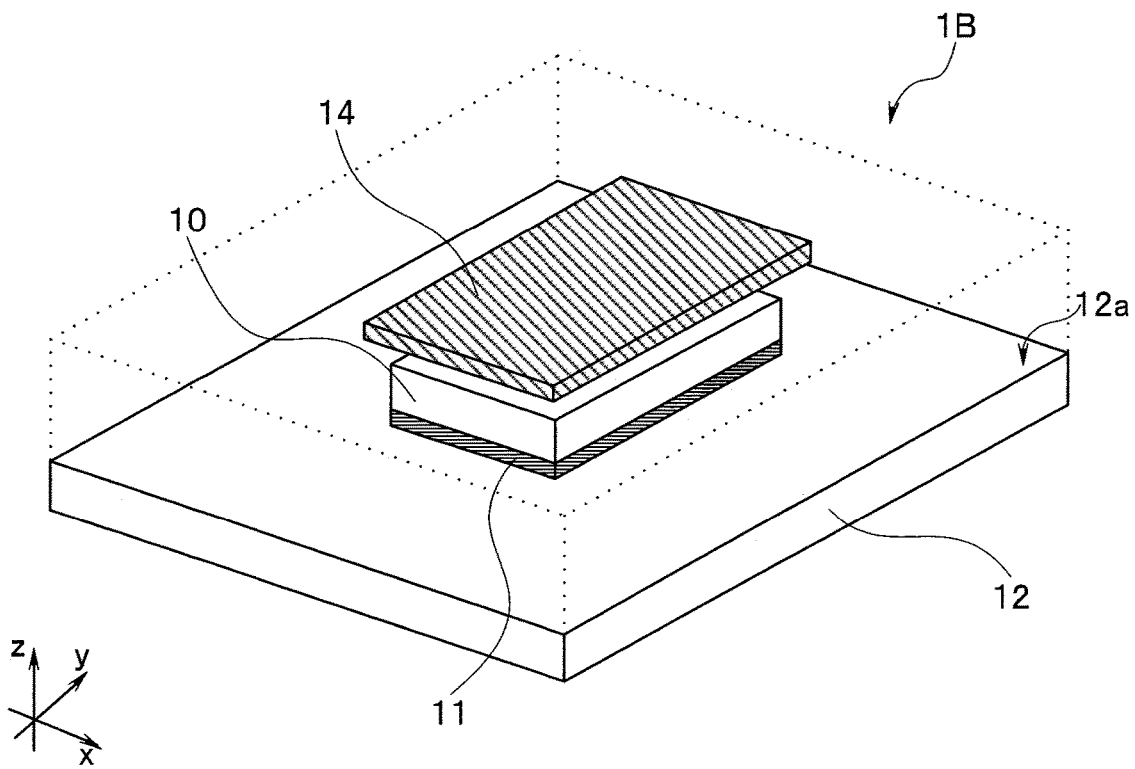
FIG. 4 is a perspective view of a semiconductor package illustrated in FIG. 3.

FIG. 3 is a cross-sectional view illustrating the structure of a semiconductor device according to a second modification of the first embodiment. FIG. 4 is a perspective view of the semiconductor package illustrated in FIG. 3. Difference of the semiconductor device 100B illustrated in FIGS. 3 and 4 from the semiconductor device 100A illustrated in FIG. 2 is a formation region of the infrared reflection layer 14 on a plane parallel to the xy plane. Other component are same as those of the semiconductor device 100A illustrated in FIG. 2 and thus is denoted by the same reference sign, and description thereof is omitted. The material of the infrared reflection layer 14 is same as that of the reflection layer 14 of the semiconductor device 100A illustrated in FIG. 2, Specifically, the infrared reflection layer 14 is formed of a metal (such as copper (Cu) or aluminum (Al)) having a low infrared absorption rate or an insulator (such as aluminum oxide ($Al_2O_3$)) having a low infrared absorption rate.

As illustrated in FIG. 3, the position of the infrared reflection layer 14 in the z axial direction in the present modification is same as that in the first modification illustrated in FIG. 2. Specifically, the infrared reflection layer 14 is disposed between the upper surface of the semiconductor chip 10 and the upper surface of a semiconductor package 1B. In the present modification, the formation region of the infrared reflection layer 14 on the xy plane is smaller than that in the first modification. For example, as illustrated in FIG. 3, the width of the infrared reflection layer 14 is slightly larger than the width of the semiconductor chip 10 at a section parallel to the x axis. The formation region of the infrared reflection layer 14 includes a formation region of the semiconductor chip 10 in the x axial direction. Specifically, the infrared reflection layer 14 is formed to have a left end protruding in the negative x axial direction beyond the left end of the semiconductor chip 10 and have a right end protruding in the positive x axial direction beyond the right end of the semiconductor chip 10.

The infrared reflection layer 14 is formed to have a width slightly larger than the width of the semiconductor chip 10 not only at a section parallel to the x axis but also in all directions on the xy plane, and the formation region of the infrared reflection layer 14 includes the formation region of the semiconductor chip 10 in each axial direction.

For example, as illustrated in FIG. 4, the infrared reflection layer 14 is formed in a rectangular shape slightly larger than the semiconductor chip 10 having a substantially rectangular shape on the xy plane and is disposed over the entire surface of the semiconductor chip 10, However, the shape of the infrared reflection layer 14 on the xy plane does not need to be same as the shape of the semiconductor chip 10 but may be any other shape that can cover the upper surface of the semiconductor chip 10, such as an elliptical shape or a strip shape.

Third Modification

The second modification above describes the formation region of the infrared reflection layer 14 when one semiconductor chip 10 is mounted in the semiconductor package 1A. In the present modification, the second modification is extended and applied to a configuration in which a plurality of semiconductor chips are mounted in a semiconductor package.

Figure 5:
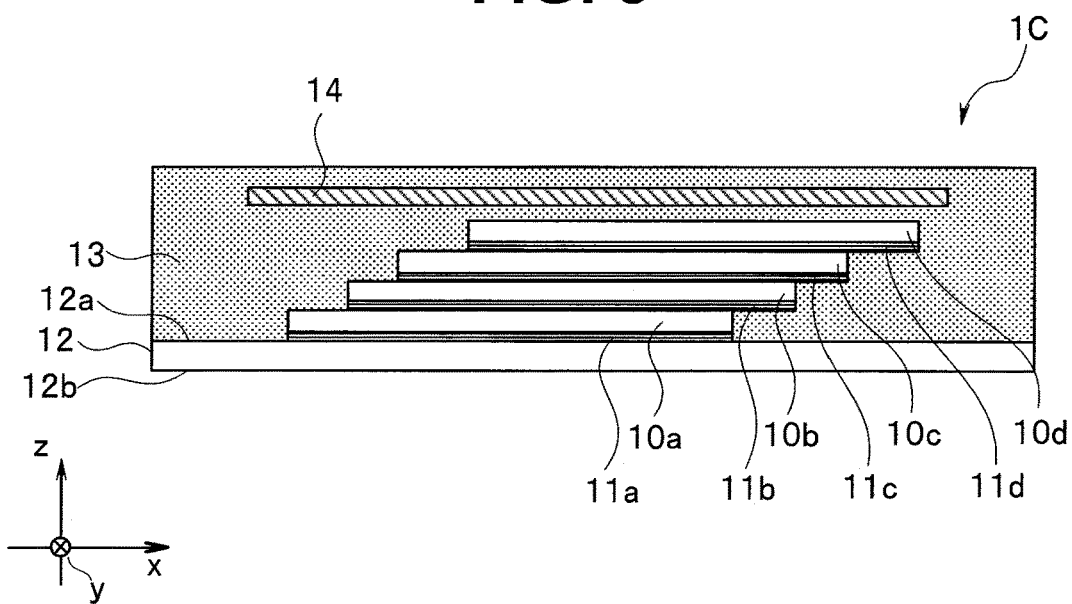
FIG. 5 is a cross-sectional view illustrating the structure of a semiconductor package according to a third modification of the first embodiment.
Figure 6:
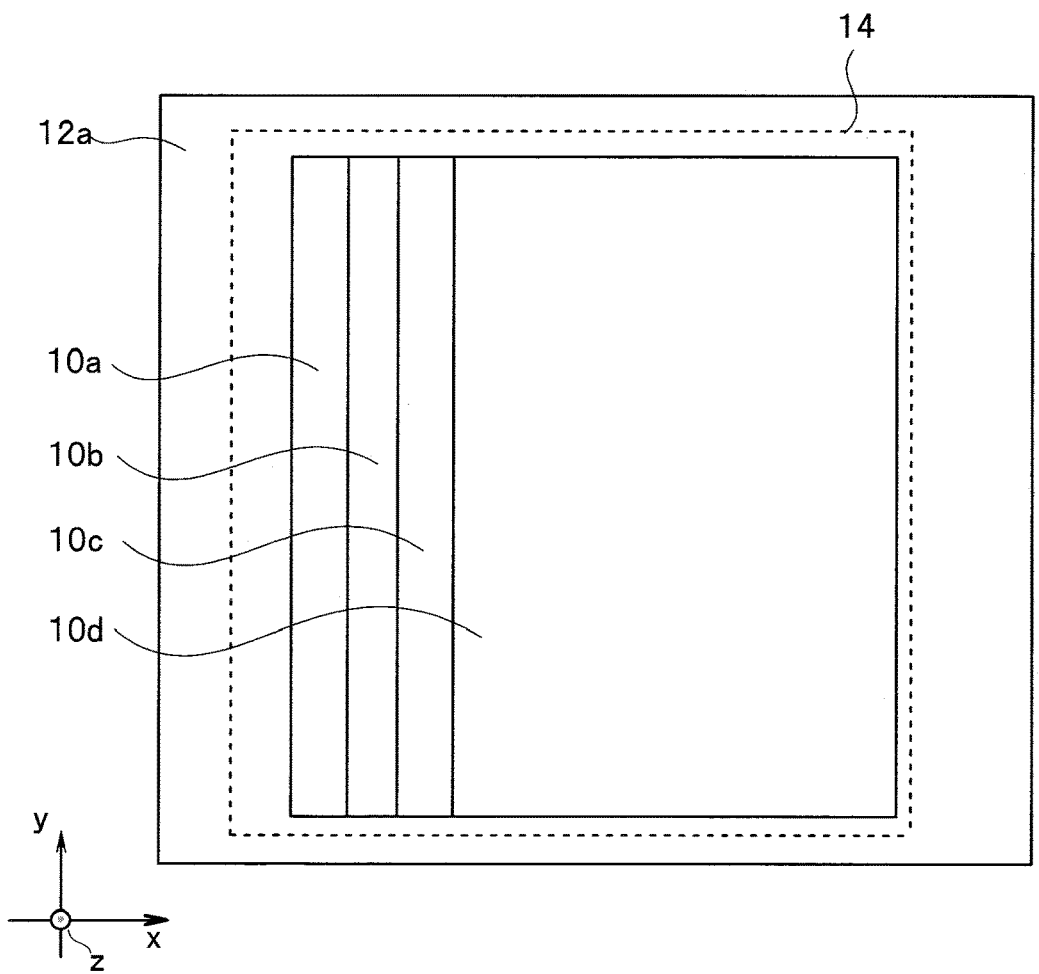
FIG. 6 is a plan view of a semiconductor package illustrated in FIG. 5 when viewed from an upper surface.
Figure 7:
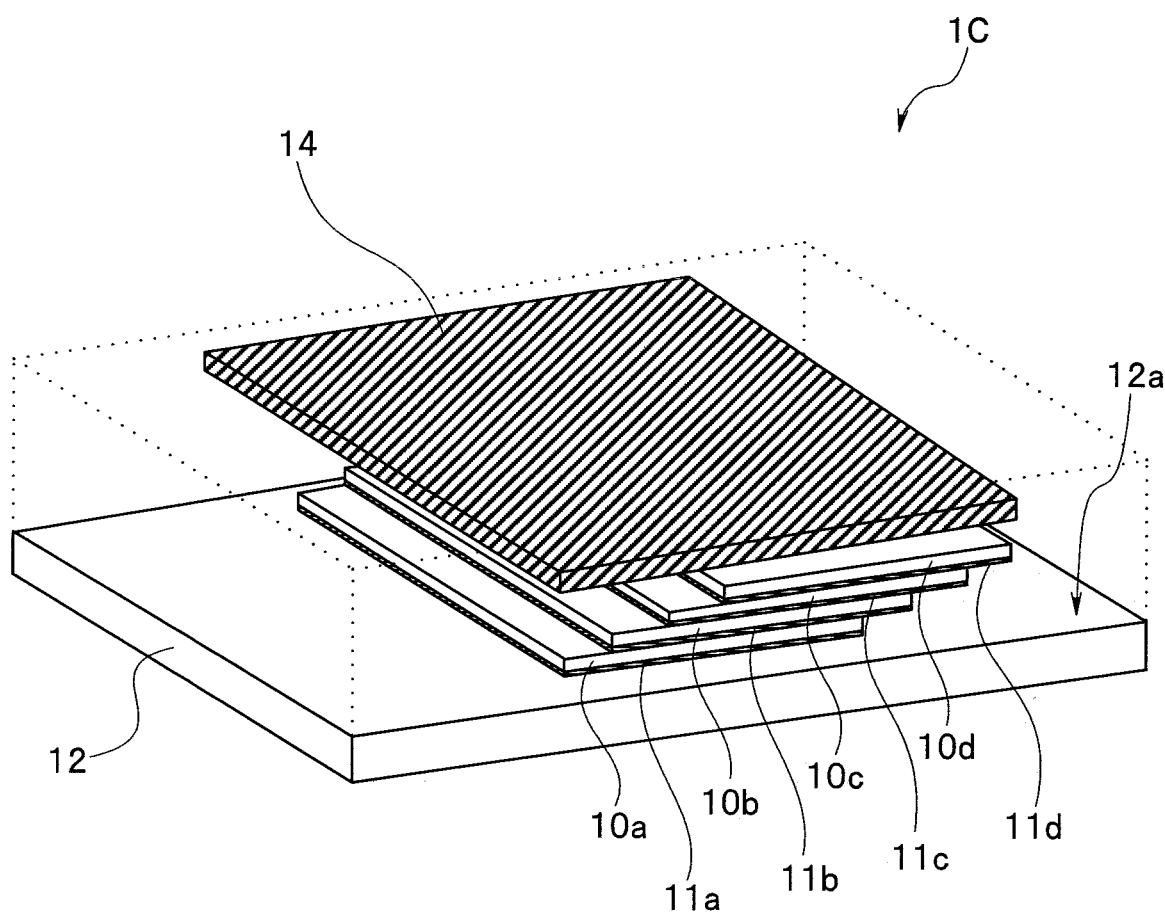
FIG. 7 is a perspective view of the semiconductor package illustrated in FIG. 5.

FIG. 5 is a cross-sectional view illustrating the structure of a semiconductor package according to a third modification of the first embodiment. FIG. 6 is a plan view of the semiconductor package illustrated in FIG. 5 when viewed from the upper surface. FIG. 7 is a perspective view of the semiconductor package illustrated in FIG. 5. The following description with reference to FIGS. 5 to 7 is made on an example in which four semiconductor chips 10a to 10d are mounted in a semiconductor package 1c.

As illustrated in FIG. 5, the semiconductor chips 10a, to 10d are provided on the first surface 12a of the wiring substrate 12. Hereinafter, the semiconductor chips 10a to 10d are simply referred to as the semiconductor chips 10 when not distinguished from one another. The semiconductor chip 10a is disposed lowest in the z axial direction among the semiconductor chips 10a to 10d, The semiconductor chips 10b, 10c, and 10d are sequentially stacked in the positive z axial direction above the semiconductor chip 10a.

The semiconductor chip 10b is displaced by a predetermined distance (for example, 300 μm approximately) relative to the semiconductor chip 10a in the positive x axial direction. The semiconductor chip 10c is displaced by a predetermined distance (for example, 300 μm approximately) relative to the semiconductor chip 10b in the positive x axial direction. The semiconductor chip 10d is displaced by a predetermined distance (for example, 300 μm approximately) relative to the semiconductor chip 10c in the positive x axial direction. In other words, part of the upper surface of each semiconductor chip 10 is not covered by another semiconductor chip 10.

Note that the semiconductor chip 10 is a semiconductor chip such as a. NAND flash memory but this is not restrictive. Other semiconductor chips may be used as the semiconductor chip 10. Although FIG. 5 illustrates the structure in which the four semiconductor chips 10 are stacked, the number of semiconductor chips 10 is optional and may be any number equal to or larger than four.

The film bonding agent 11 is bonded to the entire back surface of each semiconductor chip 10. Accordingly, the semiconductor chip 10 is firmly fixed to the wiring substrate 12 or another semiconductor chip 10 through the film bonding agent 11. Specifically, the semiconductor chip 10a is firmly fixed to the wiring substrate 12 through a film bonding agent 11a. The semiconductor chip 10b is firmly fixed to the semiconductor chip 10a through a film bonding agent 11b. The semiconductor chip 10c is firmly fixed to the semiconductor chip 10b through a film bonding agent 11c. The semiconductor chip 10d is firmly fixed to the semiconductor chip 10c through a film bonding agent 11d. Note that the semiconductor chips 10a to 10d are electrically connected with the wiring substrate 12 through a conductive-wire member (not illustrated).

As illustrated in FIG. 5, the width of the infrared reflection layer 14 is slightly larger than the width of a formation region of the semiconductor chips 10a to 10d at a section parallel to the x axis. Specifically, the infrared reflection layer 14 is formed to have a left end protruding in the negative x axial direction beyond the left end of the semiconductor chip 10a and to have a right end protruding in the positive x axial direction beyond the right end of the semiconductor chip 10d. The infrared reflection layer 14 is formed to have a width slightly larger than the width of the formation region of the semiconductor chips 10a to 10d not only at a section parallel to the x axis but also in all directions on the xy plane, and the formation region of the infrared reflection layer 14 includes the formation region of the semiconductor chips 10a to 10d in each axial direction.

For example, as illustrated in FIGS. 6 and 7, the infrared reflection layer 14 includes, on the xy plane, a region in which the semiconductor chips 10a to 10d having substantially rectangular shapes are projected in the z axial direction from above, and is formed in a region slightly larger than the region and disposed over the entire surface of the semiconductor chip 10. However, the shape of the infrared reflection layer 14 on the xy plane does not need to be same as a shape in which the semiconductor chips 10a to 10d are projected in the z axial direction from above, but may be any other shape that can cover the upper surfaces of the semiconductor chips 10a to 10d, such as an elliptical shape or a strip shape.

In this manner, in the semiconductor package is in which the plurality of semiconductor chips 10 are mounted, the infrared reflection layer 14 provided over the upper surfaces of all mounted semiconductor chips 10 can reflect infrared that would be otherwise absorbed inside the semiconductor package 1, thereby reducing the amount of heat added to the semiconductor chip 10.

Note that it is possible to form the infrared reflection layer 14 in the semiconductor package 1 in which a plurality of semiconductor chips 10 are stacked and mounted as described above. In other words, the semiconductor package 1 in which a plurality of semiconductor chips 10 are stacked and mounted is applicable to the first embodiment and the first modification as well.

Second Embodiment

The following describes a semiconductor device according to a second embodiment. Difference of the semiconductor device of the present embodiment from the above-described semiconductor device of the first embodiment is that no infrared reflection layer 14 is formed in the semiconductor package 1A and a metal film 15 is formed on the upper surface of a semiconductor chip 10. Hereinafter, components same as those in the first embodiment are denoted by the same reference signs, and detailed descriptions thereof are omitted.

Figure 8:
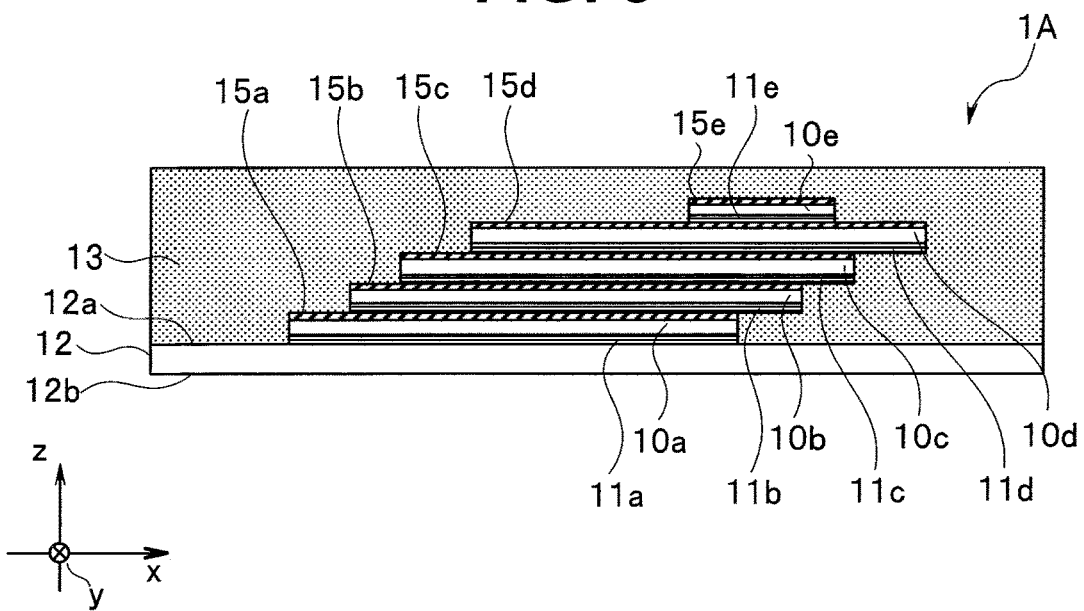
FIG. 8 is a cross-sectional view illustrating the structure of a semiconductor package according to a second embodiment.

FIG. 8 is a cross-sectional view illustrating the structure of a semiconductor package according to the second embodiment. In the semiconductor device of the present embodiment, a structure (the solder ball 3, the solder paste 22, and the printed wiring board 2) below the semiconductor package 1A is same as that in the first embodiment illustrated in FIG. 1, and thus illustration thereof is omitted. FIG. 8 only illustrates the semiconductor package 1A, which is a characteristic part of the present embodiment.

In the semiconductor package 1A illustrated in FIG. 8, a plurality of semiconductor chips, for example, five semiconductor chips 10a to 10e are stacked in the positive z axial direction. Each semiconductor chip 10 is displaced by predetermined distances in the x axial direction relative to other semiconductor chips 10 positioned above and below. In other words, part of the upper surface of each semiconductor chip 10 is not covered by the other semiconductor chips 10.

The metal film 15 of, for example, aluminum (Al) is formed at a top layer of each semiconductor chip 10. Specifically, a metal film 15a is formed at the top layer of the semiconductor chip 10a, and a metal film 15b is formed at the top layer of the semiconductor chip 10b. In addition, a metal film 15c is formed at the top layer of the semiconductor chip 10c, and a metal film 15d is formed at the top layer of the semiconductor chip 10d. Moreover, a metal film 15e is formed at the top layer of the semiconductor chip 10e. Each metal film 15 is used for power source reinforcement of the semiconductor chip 10 and can reflect infrared absorbed at the surface of the semiconductor package 1A, transmitted through the sealing resin 13, and reaching the semiconductor chip 10. Note that the metal film 15 can be inexpensively formed by using rewiring technique or the like. The metal film 15 desirably has a film thickness of 5 lam approximately. The metal film 15 may not be necessarily formed on the entire surface of the top layer of each semiconductor chip 10. For example, a region to which the conductive wire is connected may not be covered by the metal film 15.

In this manner, in the present embodiment, the metal film 15 having a low infrared absorption rate is provided at the top layer of each semiconductor chip 10. Infrared absorbed at the upper surface of the semiconductor package 1A, transmitted through the sealing resin 13, and reaching the semiconductor chip 10 is reflected by the metal film 15. Thus, the amount of radiation heat added to the semiconductor chip 10 can be reduced. In other words, increase of the temperature of the semiconductor chip 10 due to the radiation heat can reduced. Thus, it is possible to prevent degradation of data written in the semiconductor chip 10, thereby improving reliability.

Note that heat necessary for melting the solder ball 3 and the solder paste 22 is supplied as radiation heat generated at the upper and lower surfaces of the printed wiring board 2 conducts inside the printed wiring board 2. For structural reasons, the present embodiment is preferably applied to a semiconductor device including the semiconductor package 1A in which a plurality (for example, four or more) of semiconductor chips 10 are stacked and sealed as illustrated in FIG. 8.

Third Embodiment

The following describes a semiconductor device according to a third embodiment. Difference of the semiconductor device of the present embodiment from the above-described semiconductor device of the first embodiment is that no infrared reflection layer 14 is formed in a semiconductor package 1C and a wiring substrate 12A is formed of a different material. Hereinafter, components same as those in the first embodiment are denoted by the same reference signs, and detailed descriptions thereof are omitted.

Figure 9:
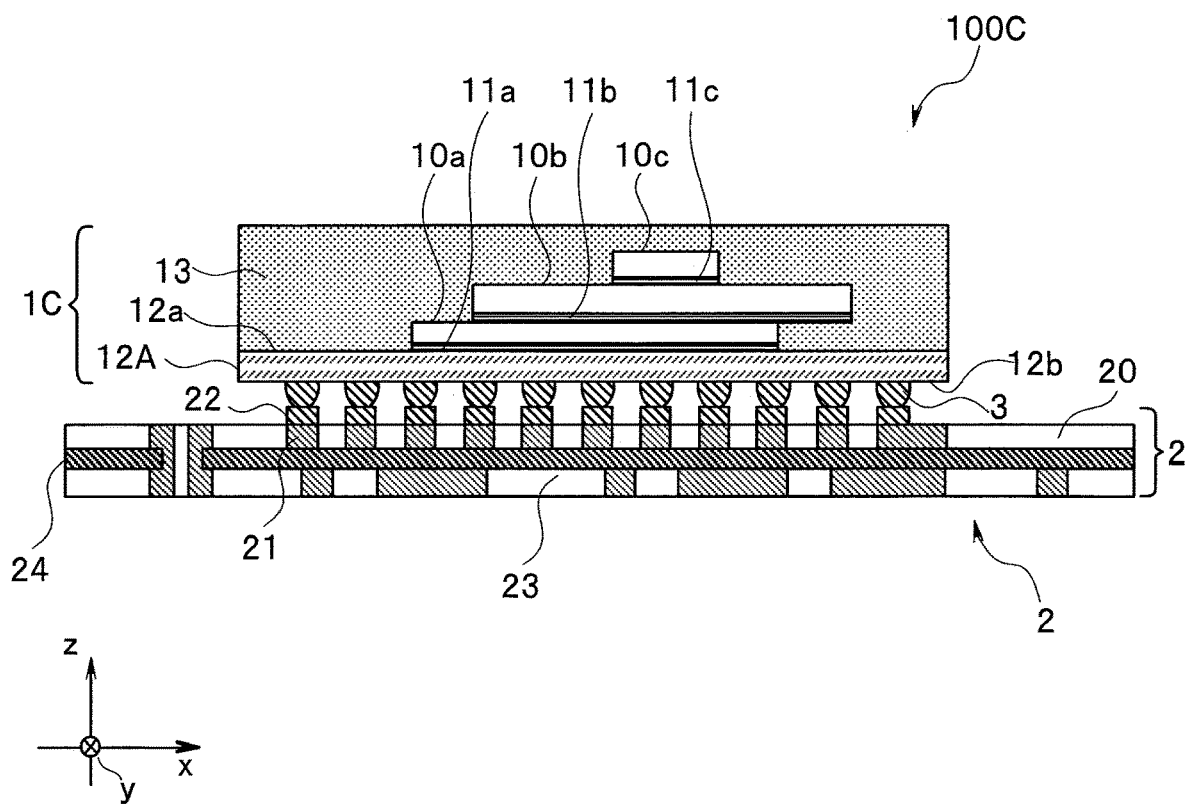
FIG. 9 is a cross-sectional view illustrating the structure of a semiconductor device according to a third embodiment.

FIG. 9 is a cross-sectional view illustrating the structure of the semiconductor device according to the third embodiment. In this semiconductor device 1000 of the present embodiment, a structure (the solder ball 3, the solder paste 22, and the printed wiring board 2) below the semiconductor package 1C is same as that in the first embodiment illustrated in FIG. 1. Surfaces of the wiring substrate 12A of the present embodiment are covered by a material (for example, a white solder resist) having a low infrared absorption rate. Specifically, both surfaces (upper and lower surfaces) of the wiring substrate 12A are covered by a material having a low infrared absorption rate.

In the present embodiment, since the surfaces (upper and lower surfaces) of the wiring substrate 12A on which a semiconductor chip 10 is placed are covered by a material having a low infrared absorption rate in this manner, infrared incident on the wiring substrate 12A is reflected at the surfaces. Thus, infrared absorption at the lower surface of the wiring substrate 12A is reduced, and the amount of radiation heat added at the lower surface of the semiconductor chip 10 can be reduced. As a result, temperature increase of the semiconductor chip 10 due to the radiation heat is reduced, which can prevent degradation of data written in the semiconductor chip 10 and improve reliability.

Note that, with the configuration of the present embodiment, since infrared is reflected at the surfaces of the wiring substrate 12A, the amount of infrared incident on the solder ball 3 and the solder paste 22 is expected to increase. Thus, the radiation heat can increase the amount of heat added to the solder ball 3 and the solder paste 22, which leads to a shortened mounting time period.

Fourth Embodiment

The following describes a semiconductor device according to a fourth embodiment. Difference of the semiconductor device of the present embodiment from the above-described semiconductor device of the first embodiment is that no infrared reflection layer 14 is formed in a semiconductor package 1D and a printed wiring board 2A is formed of a different material Hereinafter, components same as those in the first embodiment are denoted by the same reference signs, and detailed descriptions thereof are omitted.

Figure 10:
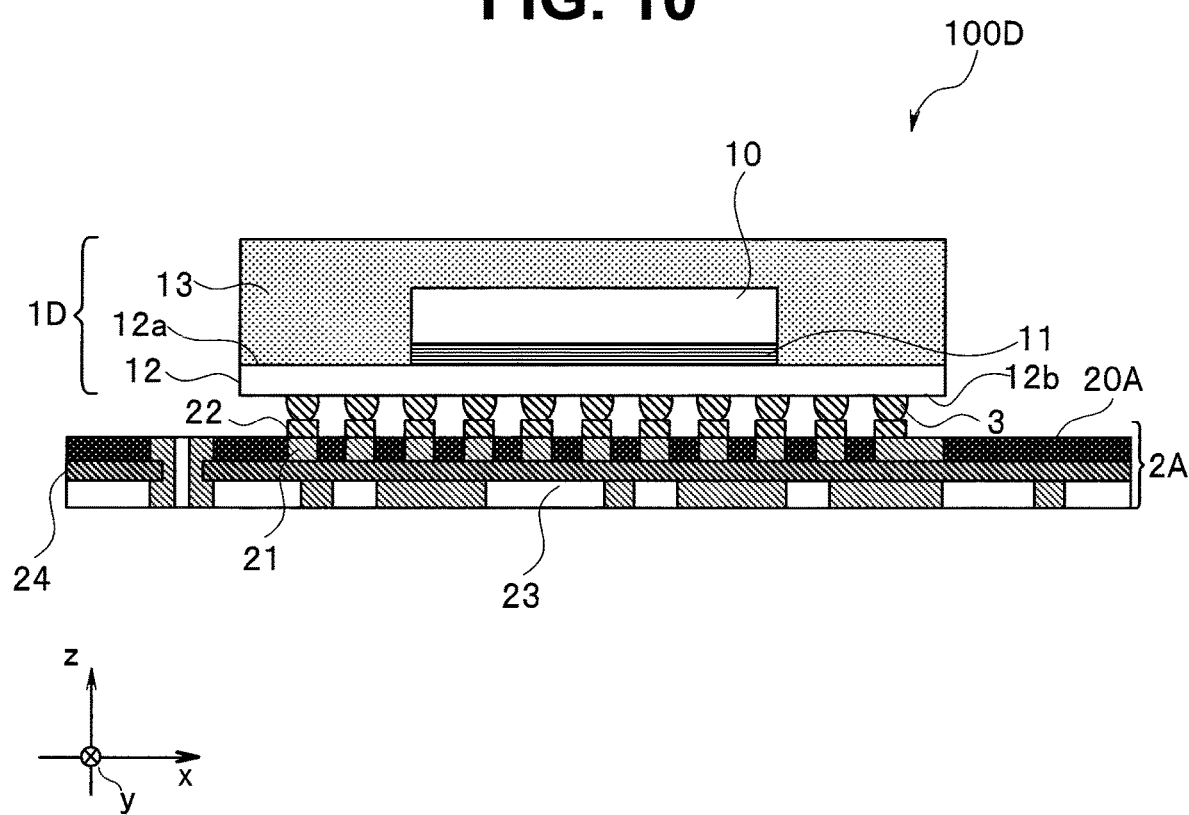
FIG. 10 is a cross-sectional view illustrating the structure of a semiconductor device according to a fourth embodiment.
Figure 11:
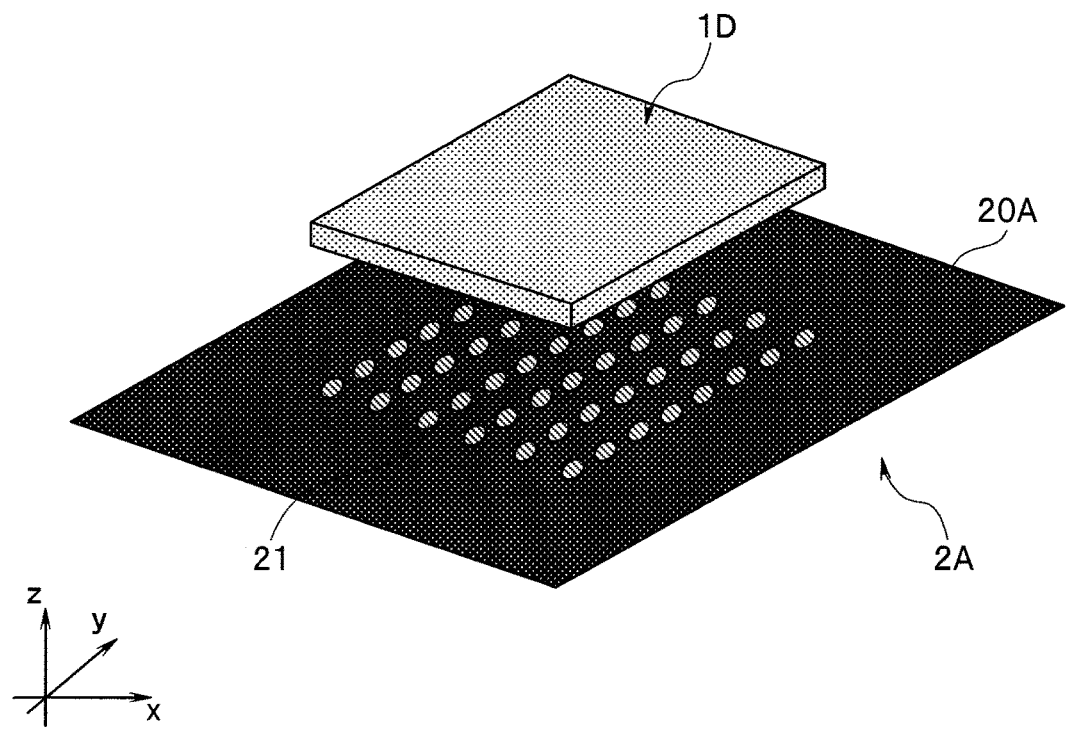
FIG. 11 is a perspective view of the semiconductor device illustrated in FIG. 10.

FIG. 10 is a cross-sectional view illustrating the structure of the semiconductor device according to the fourth embodiment. FIG. 11 is a perspective view of the semiconductor device illustrated in FIG. 10. In this semiconductor device 100I) of the present embodiment, as a circuit protection layer 20A of the printed wiring board 2A is formed of a material (for example, a black solder resist) having a high infrared absorption rate. The circuit protection layer 20A is formed of, for example, carbon black or carbon nanotube black body, which has an absorption rate of 85% approximately or 99.7% approximately, respectively, for infrared of a wavelength of 3 to 5 μm. Alternatively, the circuit protection layer 20A may be formed of diamond-like carbon or insulation paste containing microcrystal diamond. The circuit protection layer 20A on the entire upper and lower surfaces of the printed wiring board 2A is desirably formed of a material having a high infrared absorption rate, but it suffices that at least the circuit protection layer 20A on the upper surface is formed of a material having a high infrared absorption rate.

In the present embodiment, since at least the upper surface of the printed wiring board 2A is covered by a material having a high infrared absorption rate in this manner, the amount of radiation heat generated by infrared absorbed by the printed wiring board 2A can be increased. As a result, the amount of heat transferred from the printed wiring board 2A to the solder ball 3 and the solder paste 22 increases, and thus mounting can be performed in a short time period. The reduced mounting time period can lead to reduction of temperature increase of the semiconductor chip 10 due to radiation heat generated by infrared absorbed at the upper surface of the semiconductor package 1D. Thus, it is possible to prevent degradation of data written in the semiconductor chip 10, thereby improving reliability.

In other words, in the present embodiment, the speed of temperature increase of the printed wiring board 2A is increased by increasing the amount of radiation heat generated by infrared absorbed by the printed wiring board 2A. According, the speed of temperature increase of the semiconductor package 1 becomes lower than the speed of temperature increase of the printed wiring board 2. Thus, the duration until heat conducts in an amount necessary for melting the solder ball 3 and the solder paste 22 and the semiconductor package 1 and the printed wiring board 2 are mounted is reduced, which leads to reduction of the amount of heat conducting to the semiconductor chip 10 in the duration. As a result, temperature increase of the semiconductor chip 10 is reduced, which can prevent degradation of written data and improve reliability.

Fifth Embodiment

The following describes a semiconductor device according to a fifth embodiment. In this semiconductor device 100E of the present embodiment, a printed wiring board 2B has a configuration different from that in the above-described semiconductor device of the fourth embodiment. Hereinafter, components same as those in the fourth embodiment are denoted by the same reference signs, and detailed descriptions thereof are omitted.

Figure 12:
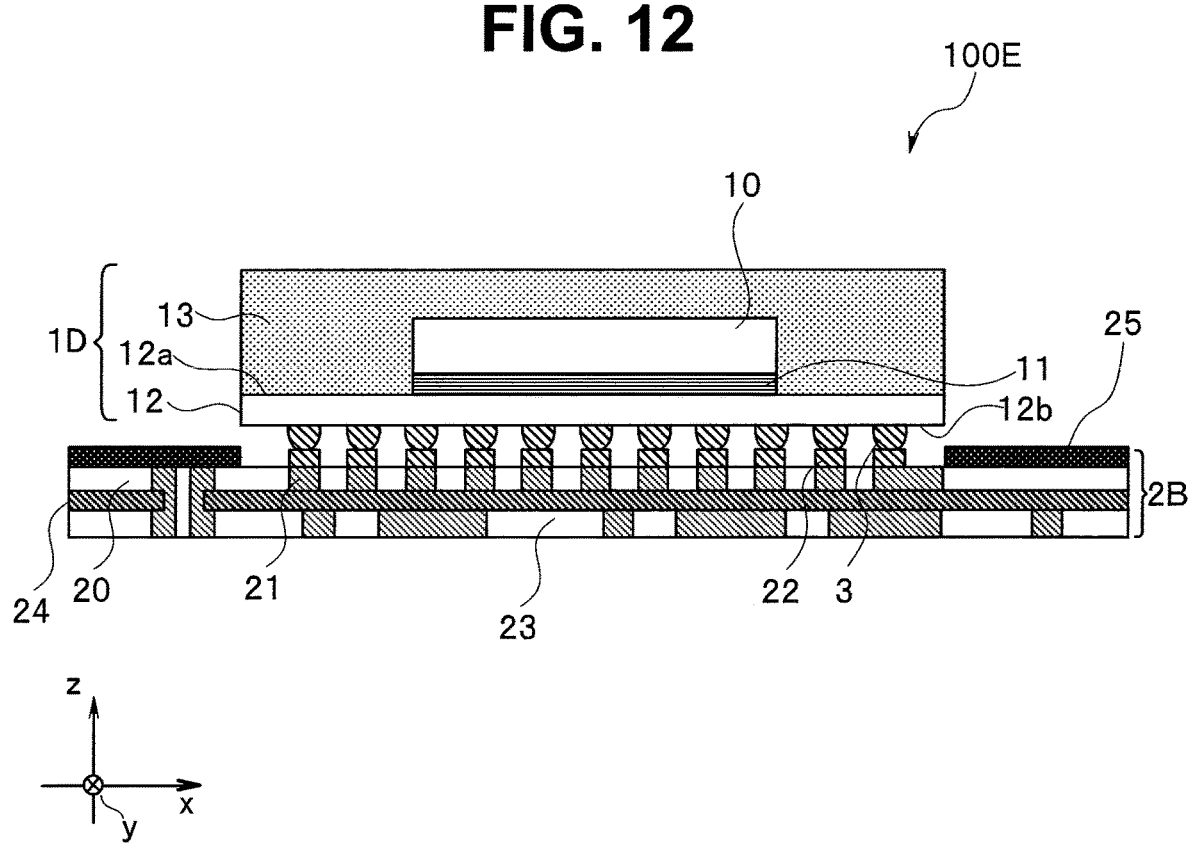
FIG. 12 is a cross-sectional view illustrating the structure of a semiconductor device according to a fifth embodiment.
Figure 13:
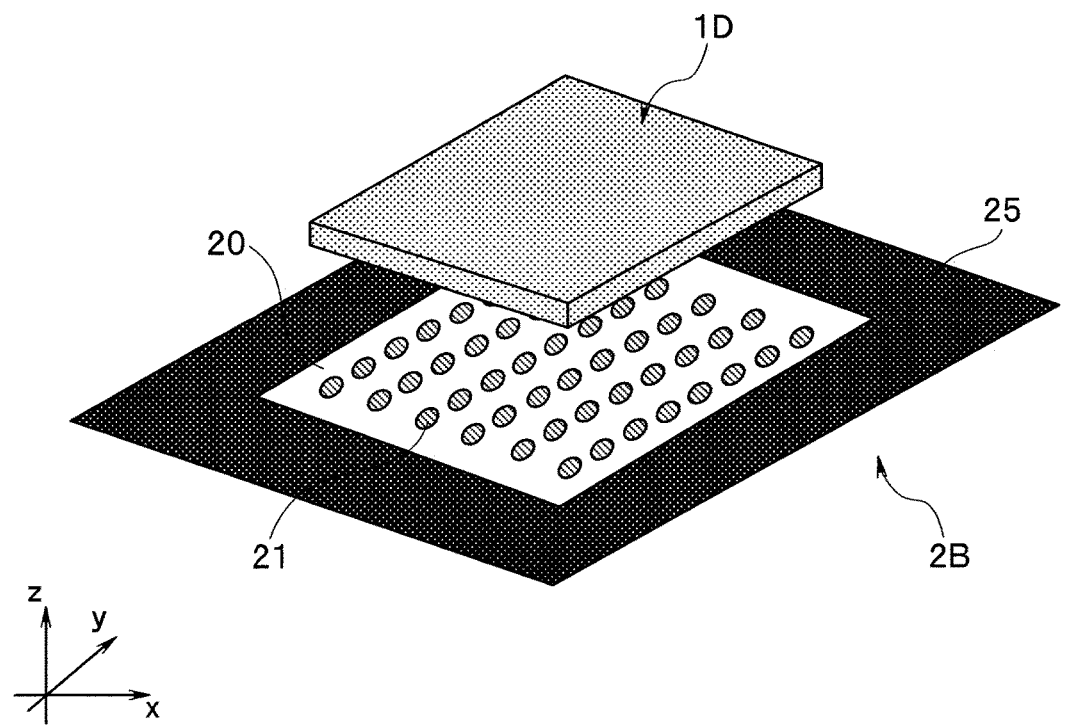
FIG. 13 is a perspective view of the semiconductor device illustrated in FIG. 12.

FIG. 12 is a cross-sectional view illustrating the structure of the semiconductor device according to the fifth embodiment. FIG. 13 is a perspective view of the semiconductor device illustrated in FIG. 12. In the semiconductor device 100E of the present embodiment, an infrared absorption layer 25 formed of a material (for example, a black solder resist) having a high infrared absorption rate is provided on a surface of the circuit protection layer 20 formed at the upper surface of the printed wiring board 2B. Similarly to the circuit protection layer 20A in the fourth embodiment, the infrared absorption layer 25 is formed of, for example, carbon black or carbon nanotube black body, which has an absorption rate of 85% approximately or 99.7% approximately, respectively, for infrared having a wavelength of 3 to 0.5 μm. Alternatively, the circuit protection layer 20A may be formed of diamond-like carbon or insulation paste containing microcrystal diamond. The infrared absorption layer 25 is formed in a region not covered by a semiconductor package 1E when projected from above on the surface of the circuit protection layer 20 formed at the upper surface of the printed wiring board 2B, in other words, the infrared absorption layer 25 is not formed in a central region in which the mounting substrate terminal 21 is formed on the upper surface of the printed wiring board 2B, but is formed in a peripheral region surrounding the central region. Note that the infrared absorption layer 25 may be formed at the entire surface of the circuit protection layer 20 formed at the upper surface of the printed wiring board 2B.

In the present embodiment, since the upper surface of the printed wiring board 2B is covered by the infrared absorption layer 25 firmed of a material having a high infrared absorption rate, the amount of radiation heat generated by infrared absorbed by the printed wiring board 2B can be increased. As a result, the amount of heat transferred from the printed wiring board 2B to the solder ball 3 and the solder paste 22 increases, and thus mounting of the semiconductor package 1D can be performed in a short time period. The reduced mounting time period can lead to reduction of temperature increase of the semiconductor chip 10 due to radiation heat generated by infrared absorbed at the upper surface of the semiconductor package 1D. Thus, it is possible to prevent degradation of data written in the semiconductor chip 10, thereby improving reliability.

Moreover, the infrared absorption layer 25 can be formed in an optional region of the printed wiring board 2B, and thus can be selectively formed in a region in which infrared is incident in a larger amount (for example, a region not covered by the semiconductor package 1E when projected from above). Accordingly, the infrared absorption layer 25 can be formed only at a necessary place, which leads to efficient infrared absorption and reduction of the amount of material used, thereby preventing cost increase.

Figure 14:
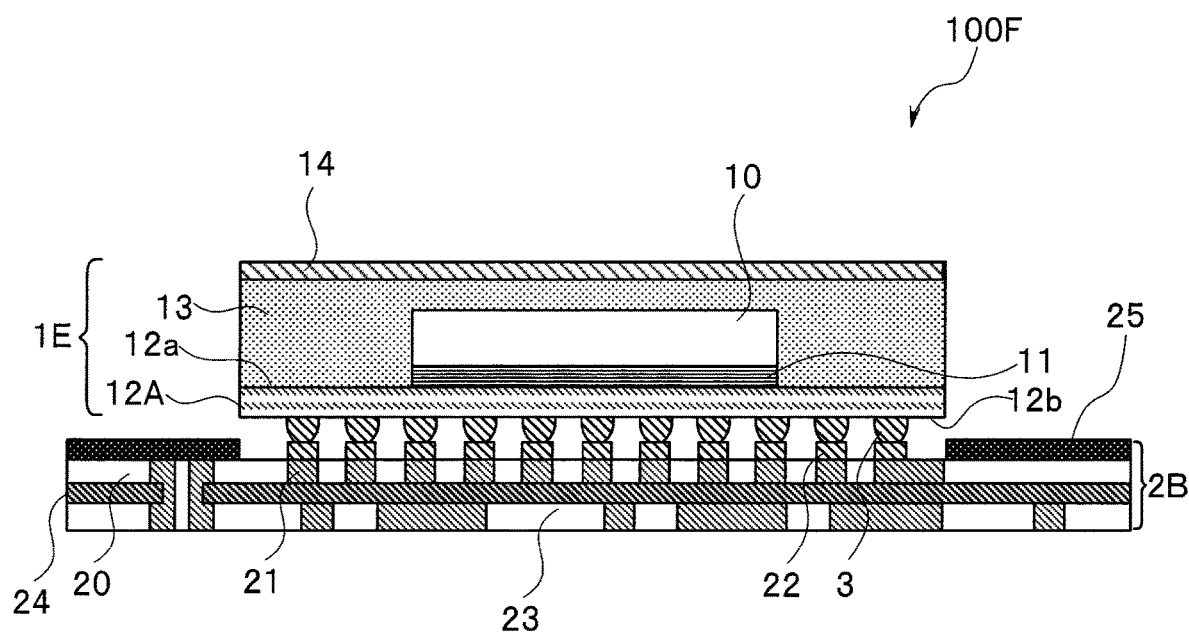
FIG. 14 is a cross-sectional view illustrating the structure of another semiconductor device according to the fifth embodiment.
Figure 14:
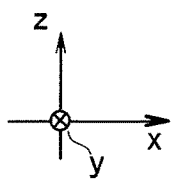

Note that a component of another embodiment may be used in combination with the above-described semiconductor device 100E. FIG. 14 is a cross-sectional view illustrating the structure of another semiconductor device according to the fifth embodiment. In this semiconductor device 100E illustrated in FIG. 14, the wiring substrate 12 among the components of the semiconductor device 100E illustrated in FIG. 13 is replaced with the wiring substrate 12A (wiring substrate having a surface covered by a material (for example, a white solder resist) having a low infrared absorption rate) employed in the third embodiment. In other words, the semiconductor device 100F illustrated in FIG. 14 has a configuration as a combination of the configurations of the third embodiment and the fifth embodiment.

In this case, the amount of radiation heat generated in the printed wiring board 2B is increased by the infrared absorption layer 25 to increase the amount of heat transferred inside the printed wiring board 2B and added to the solder ball 3 and the solder paste 22, and the amount of heat directly added to the solder ball 3 and the solder paste 22 is increased by infrared reflected at the surface of the wiring substrate 12A, Thus, the mounting time period can be further reduced. Moreover, absorption of infrared at the lower surface of the wiring substrate 12A is reduced, and accordingly, the amount of radiation heat added at the lower surface of the semiconductor chip 10 can be reduced. As a result, temperature increase of the semiconductor chip 10 due to the radiation heat is further reduced.

Although the above description is made on the semiconductor device 100F having a configuration as a combination of the third embodiment and the fifth embodiment, another embodiment may be combined. For example, the semiconductor package 1 of the first embodiment and the printed wiring board 2A of the fourth embodiment may be combined, or the semiconductor package 1C of the second embodiment and the printed wiring board 2B of the fifth embodiment may be combined. Alternatively, the configurations of three or more embodiments may be combined, for example, the semiconductor package 1C of the third embodiment may be combined with the infrared reflection layer 14 of the first embodiment and the printed wiring board 2A of the fourth embodiment.

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor package including
      a wiring substrate having a first surface and a second surface on a side opposite to the first surface and covered by a white solder resist,
      a semiconductor chip provided on an upper side of the first surface of the wiring substrate,
      a sealing resin covering the first surface of the wiring substrate and the semiconductor chip, and
      an external terminal provided on the second surface of the wiring substrate, wherein
      the wiring substrate being electrically connectable with a printed wiring board through the external terminal; and
   a print wiring substrate including
      a mounting substrate,
      a wiring layer provided on an upper side of the mounting substrate and electrically connectable with the external terminal, and
      an infrared absorption layer provided on an upper side of the wiring layer and formed of any of carbon black, carbon nanotube, diamond-like carbon, or insulation paste containing microcrystal diamond.

2. The semiconductor device according to claim 1, wherein the infrared absorption layer is formed outside a region in which the semiconductor package is disposed on the print wiring substrate.

3. The semiconductor device according to claim 1, wherein the external terminal is a solder ball.

4. The semiconductor device according to claim 1, wherein the external terminal is a solder ball.

5. A semiconductor device comprising:
   a semiconductor package including
      a wiring substrate having a first surface and a second surface on a side opposite to the first surface,
      a semiconductor chip provided on the first surface of the wiring substrate,
      a sealing resin covering the first surface of the wiring substrate and surfaces of the semiconductor chip, and
      an external terminal provided on the second surface of the wiring substrate; and
   a print wiring substrate including
      a mounting substrate,
      a wiring layer provided on an upper side of the mounting substrate and electrically connectable with the external terminal, and
      an infrared absorption layer provided on an upper side of the wiring layer and formed of any of carbon black, carbon nanotube, diamond-like carbon, or insulation paste containing microcrystal diamond, wherein
   the wiring substrate is electrically connectable with the printed wiring board through the external terminal.

6. The print wiring substrate according to claim 5, wherein the infrared absorption layer is formed outside a region in which the semiconductor package is disposed on the print wiring substrate.

7. The print wiring substrate according to claim 5, wherein the external terminal is a solder ball.

* * * * *